(12) United States Patent
Kim et al.

(10) Patent No.: US 9,985,025 B1
(45) Date of Patent: May 29, 2018

(54) ACTIVE PATTERN STRUCTURE AND SEMICONDUCTOR DEVICE INCLUDING THE SAME

(71) Applicant: Samsung Electronics Co., Ltd., Suwon-si, Gyeonggi-do (KR)

(72) Inventors: Ki-Il Kim, Suwon-si (KR); Seung-Jin Mun, Suwon-si (KR); Kwang-Yong Yang, Seoul (KR); Young-Mook Oh, Hwaseong-si (KR); Ah-Young Cheon, Suwon-si (KR); Seung-Mo Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/496,145

(22) Filed: Apr. 25, 2017

(30) Foreign Application Priority Data

Nov. 24, 2016 (KR) .......................... 10-2016-0157356

(51) Int. Cl.
| | | |
|---|---|---|
| *H01L 29/00* | (2006.01) | |
| *H01L 21/311* | (2006.01) | |
| *H01L 27/088* | (2006.01) | |
| *H01L 29/06* | (2006.01) | |
| *H01L 29/10* | (2006.01) | |
| *H01L 21/8234* | (2006.01) | |

(52) U.S. Cl.
CPC .. *H01L 27/0886* (2013.01); *H01L 21/823431* (2013.01); *H01L 21/823481* (2013.01); *H01L 29/0649* (2013.01); *H01L 29/1033* (2013.01)

(58) Field of Classification Search
CPC ......... H01L 21/31116; H01L 21/31144; H01L 21/3065; H01L 21/76804; H01L 21/76224; H01L 21/76232; H01L 21/76229; H01L 21/763; H01L 21/76286
USPC .................. 438/700–702; 257/510, 513, 520
See application file for complete search history.

(56) References Cited

U.S. PATENT DOCUMENTS

| | | | |
|---|---|---|---|
| 7,115,525 | B2 | 10/2006 | Abatchev et al. |
| 7,396,781 | B2 | 7/2008 | Wells |
| 7,807,575 | B2 | 10/2010 | Zhou |
| 8,110,506 | B2 | 2/2012 | Min et al. |
| 8,642,428 | B2 | 2/2014 | Kim |
| 8,889,561 | B2 | 11/2014 | Woo et al. |

(Continued)

FOREIGN PATENT DOCUMENTS

| | | |
|---|---|---|
| JP | 2004/241586 A | 8/2004 |
| KR | 2012/0120845 A | 11/2012 |

*Primary Examiner* — Hsien Ming Lee
(74) *Attorney, Agent, or Firm* — Harness, Dickey & Pierce, P.L.C.

(57) ABSTRACT

An active pattern structure may include a substrate including an active pattern array defined by a plurality of trenches including first to third trenches, and first to third isolation patterns in the first to third trenches, respectively. The active pattern array may include a plurality of first and second active patterns extending in a first direction, and the first to third trenches may be between the first and second active patterns and may include different widths from each other. The active pattern array may include an active pattern group including one of the first active patterns and one of the second active patterns sequentially arranged in a second direction substantially perpendicular to the first direction. Each of the first and second active patterns may have a minute width.

20 Claims, 17 Drawing Sheets

(56) References Cited

U.S. PATENT DOCUMENTS

| | | |
|---|---|---|
| 8,941,153 B2 | 1/2015 | Lee et al. |
| 9,214,358 B1 | 12/2015 | Lin et al. |
| 2007/0205438 A1* | 9/2007 | Juengling .......... H01L 21/0337 257/216 |
| 2016/0056048 A1 | 2/2016 | Honda |
| 2016/0093501 A1 | 3/2016 | Ogasawara |

* cited by examiner

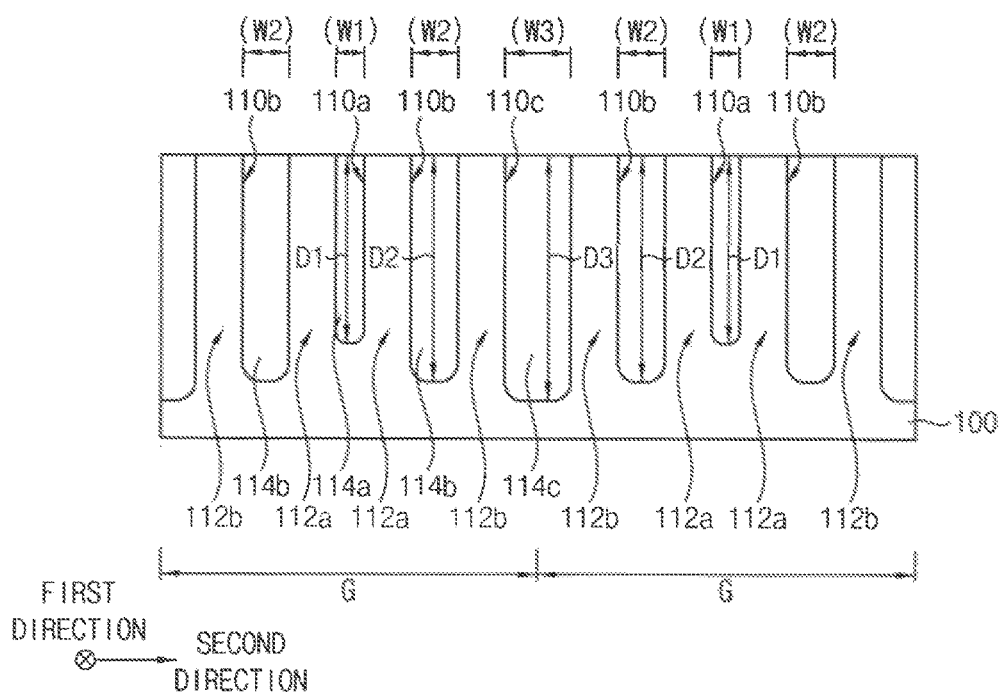
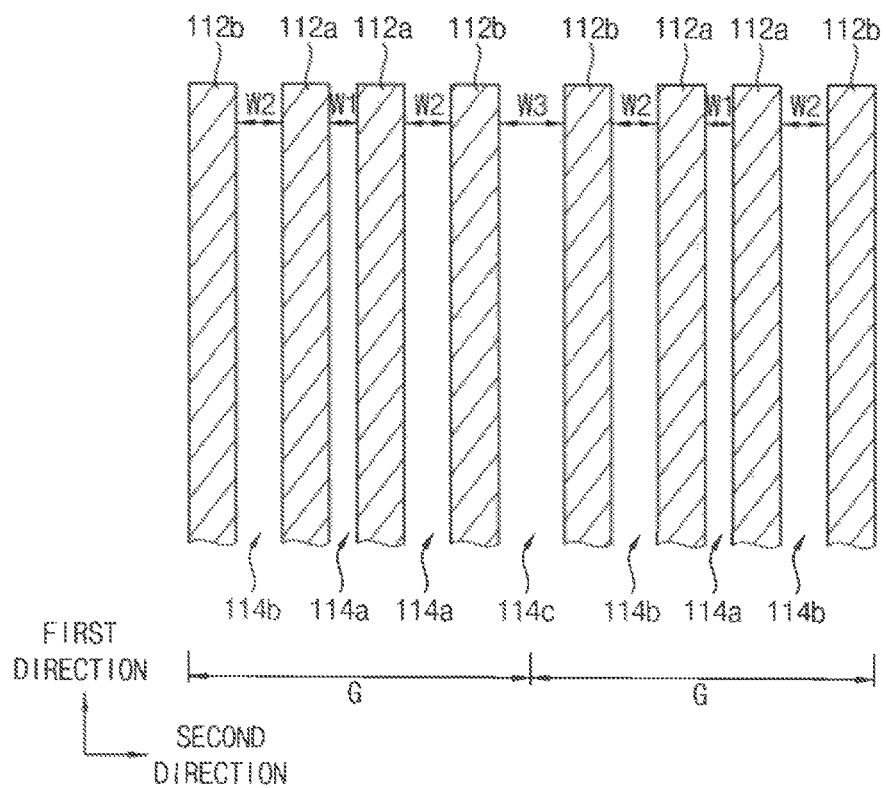

ACTIVE PATTERN STRUCTURE AND SEMICONDUCTOR DEVICE INCLUDING THE SAME

CROSS-REFERENCE TO RELATED APPLICATION

This application claims priority under 35 USC § 119 to Korean Patent Application No. 10-2016-0157356, filed on Nov. 24, 2016 in the Korean Intellectual Property Office (KIPO), the contents of which are herein incorporated by reference in their entirety.

BACKGROUND

1. Field

The present disclosure relates to an active pattern structure and a semiconductor device including the active pattern structure.

2. Description of Related Art

In order to manufacture highly integrated semiconductor devices, active patterns having a minute critical dimension that are spaced apart from each other by a minute distance may be formed.

SUMMARY

Some example embodiments relate to an active pattern structure including active patterns having a minute critical dimension that are spaced apart from each other by a minute distance.

Some example embodiments provide a semiconductor device including the active pattern structure.

According to some example embodiments, an active pattern structure includes a substrate including an active pattern array defined by a plurality of trenches in the substrate. The active pattern array may include a plurality of first and second active patterns that each extend in a first direction. The active pattern array may include an active pattern group. The active pattern group may include one of the first active patterns and one of the second active patterns sequentially arranged in a second direction substantially perpendicular to the first direction. The plurality of trenches may include a first trench, a second trench and a third trench between the first and second active patterns. Widths of the first to third trenches may be different from each other. A first isolation pattern, a second isolation pattern and a third isolation pattern may be in the first, second and third trenches, respectively.

According to some example embodiments, a semiconductor device may include a substrate including an active pattern array defined by a plurality of trenches in the substrate. The active pattern array may include a plurality of first and second active patterns extending in a first direction. The plurality of trenches may include a first trench, a second trench, and a third trench disposed between the first and second active patterns. Widths of the first trench, the second trench, and the third trench may be different from each other. The first trench may be disposed between adjacent first active patterns among the first active patterns. The second trench may be disposed between two of the second active patterns and the adjacent first active patterns. The third trench may be disposed between two adjacent second active patterns among the second active patterns. A first isolation pattern, a second isolation pattern and a third isolation pattern may be in the first, second and third trenches, respectively. A transistor may be on the active pattern array and the first, second and third isolation patterns.

According to example embodiments, an active pattern structure of a semiconductor device may include a substrate including a plurality of first active patterns and a plurality of second active patterns defined by a plurality of trenches in the substrate. The plurality of trenches may include a plurality of first trenches, a plurality of second trenches, and a plurality of third trenches extending in a first direction. A depth of the plurality of second trenches may be greater than a depth of the plurality of first trenches and less than a depth of the plurality of third trenches. The plurality of first active patterns and the plurality of second active patterns may extend in the first direction and may be organized into a plurality of active pattern groups. At least one active pattern group among the active pattern groups may be between a pair of the plurality of third trenches. The at least one active pattern group among the active pattern groups may include a pair of the first active patterns between a pair of the second active patterns and may be separated from the pair of the second active patterns by a pair of the plurality of second trenches. The pair of the first active patterns may be spaced apart from each other in the second direction by one of the plurality of first trenches.

In accordance with some example embodiments, the active pattern structure may include the active patterns having a minute critical dimension and a minute space therebetween. Thus, the semiconductor device formed on the active pattern structure may have a high integration.

BRIEF DESCRIPTION OF THE DRAWINGS

Inventive concepts will be more clearly understood from the following detailed description taken in conjunction with the accompanying drawings. FIGS. 1A, 1B and 2 to 32 represent non-limiting, example embodiments as described herein.

FIGS. 1A and 1B are a cross-sectional view and a plan view, respectively, illustrating an active pattern structure in accordance with some example embodiments;

FIGS. 2 to 9 are cross-sectional views illustrating operations of a method of forming an active pattern structure in accordance with some example embodiments;

FIGS. 10 to 13 are cross-sectional views illustrating operations of a method of forming an active pattern structure in accordance with some example embodiments;

FIGS. 14 to 22 are cross-sectional views illustrating operations of a method of manufacturing a semiconductor device in accordance with some example embodiments;

FIGS. 23 to 26 are cross-sectional views illustrating operations of a method of manufacturing a semiconductor device in accordance with some example embodiments; and FIGS. 27 to 32 are plan views and cross-sectional views illustrating operations of a method of forming an active pattern structure in accordance with some example embodiments.

DETAILED DESCRIPTION

Figure 2:
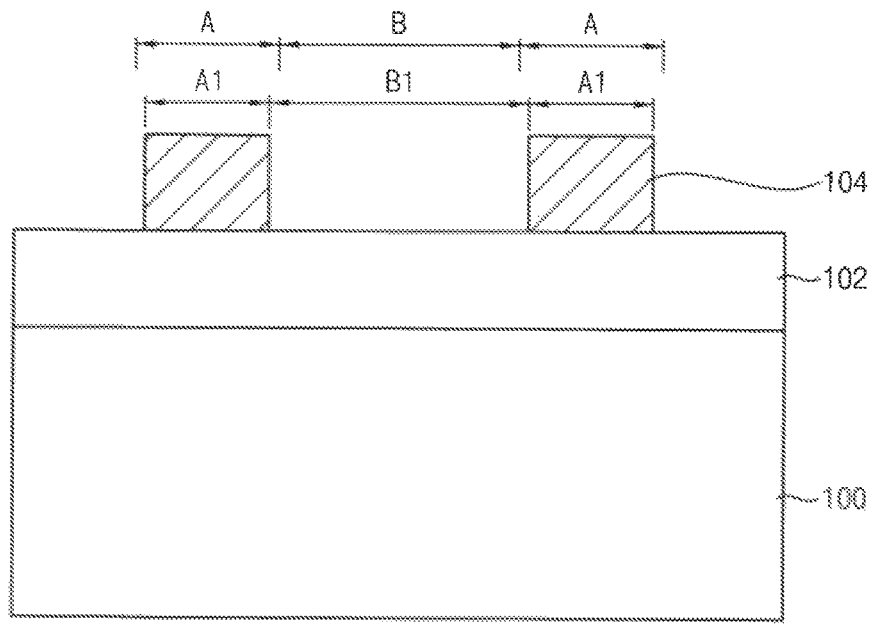

FIGS. 1A and 1B are a cross-sectional view and a plan view, respectively, illustrating an active pattern structure in accordance with some example embodiments.

Hereinafter, an extension direction of an active pattern is referred to as a first direction, and a direction substantially perpendicular to the first direction is referred to as a second direction.

Referring to FIGS. 1A and 1B, an active pattern structure may be formed on a substrate 100. The active pattern structure may include a plurality of first active patterns 112a, a plurality of second active patterns 112b, a first isolation pattern 114a, a second isolation pattern 114b and a third isolation pattern 114c. The first and second active patterns 112a and 112b may protrude from a surface of the substrate 100. The first, second and third isolation patterns 114a, 114b and 114c may fill gaps between the first and second active patterns 112a and 112b.

The substrate 100 may include a semiconductor material, e.g., silicon, germanium, silicon-germanium, etc. In some example embodiments, the substrate 100 may be a silicon-on-insulator (SOI) substrate or a germanium-on-insulator (GOI) substrate.

In some example embodiments, the first and second active patterns 112a and 112b and the substrate 100 may be a one-body structure. That is, an upper portion of an initial substrate may be partially etched to form the first and second active patterns 112a and 112b. Thus, the first and second active patterns 112a and 112b may include a semiconductor material.

The first and second active patterns 112a and 112b may extend in the first direction. A first trench 110a, a second trench 110b and a third trench 110c may be formed between the first and second active patterns 112a and 112b. The first, second and third isolation patterns 114a, 114b and 114c may be formed in the first, second and third trenches 110a, 110b and 110c, respectively.

Critical dimensions in the second direction of the first and second active patterns 112a and 112b may be the same as (or substantially the same as) each other. In some example embodiments, each of the first and second active patterns 112a and 112b may have a first critical dimension in the second direction.

In some example embodiments, two first active patterns 112a and two second active patterns 112b may be repeatedly arranged in the second direction, which may define an active pattern array.

The active pattern array may include a plurality of active pattern groups G arranged in the second direction. Each of the active pattern groups G may include the second active pattern 112b, the first active pattern 112a, the first active pattern 112a and the second active pattern 112b sequentially arranged in the second direction.

The first trench 110a may be disposed between adjacent two first active patterns 12a. The second trench 110b may be disposed between adjacent first and second active patterns 112a and 112b. The third trench 110c may be disposed between adjacent two second active patterns 112b.

The first and second active patterns 112a and 112b included in the active pattern group G may be symmetric with respect to the first trench 110a. That is, adjacent two first active patterns 112a may be symmetric with respect to the first trench 110a. Adjacent two second active patterns 112b may be symmetric with respect to the third trench 110c. In other words, in the active pattern group G, a pair of first active patterns 112a may be separated by the first trench 110a and between a pair of second active patterns 112b. In the active pattern group G, the pair of second active patterns 112b may be between a pair of third trenches 110c and separated by a corresponding pair of the first active patterns 112a and first trench 110b between the corresponding pair of the first active patterns 112a.

In the active pattern array, the second trench 110b and the third trench 110c may be sequentially disposed in the second direction from each of opposite sidewalls of the first trench 110a.

Depths of the first, second and third trenches 110a, 110b and 110c may be different from each other. Widths of the first, second and third trenches 110a, 110b and 110c may be different from each other.

Particularly, the first trench 110a may have a first depth D1. The second trench 110b may have a second depth D2 greater than the first depth D1, and the third trench 110c may have a third depth D3 greater than the second depth D2. In some example embodiments, the first depth D1 may be in a range of about 70% to about 100% of the second depth D2, and the third depth D3 may be in a range of about 100% to about 130% of the second depth D2.

The first active pattern 112a may have a first sidewall corresponding to a sidewall of the first trench 110a and a second sidewall corresponding to a sidewall of the second trench 110b. Thus, the first sidewall of the first active pattern 112a may have a length from a top portion to a bottom different from a length from a top portion to a bottom of the second sidewall of the first active pattern 112a.

The second active pattern 112b may have a third sidewall corresponding to a sidewall of the second trench 110b and a fourth sidewall corresponding to a sidewall of the third trench 110c. Thus, the third sidewall of the second active pattern 112b may have a length different from a length of the fourth sidewall of the second active pattern 112b.

Thus, a length of the second active pattern 112b may be greater than a length of the first active pattern 112a. In some example embodiments, upper surfaces of the first and second active patterns may be substantially coplanar with each other.

The first trench 110a may have a first width W1. The second trench 110b may have a second width W2 greater than the first width W1, and the third trench 110c may have a third width W3 greater than the second width W2. In some example embodiments, the first width W1 may be in a range of about 80% to about 100% of the second width W2, and the third width W3 may be in a range of about 100% to about 120% of the second width W2. In some example embodiments, the second width W2 may be the same as (or substantially the same as) the first critical dimension of each of the first and second active patterns 112a and 112b.

Thus, the second trench 110b, the first trench 110a, the second trench 110b and the third trench 110c may be sequentially arranged in the second direction.

The first, second and third isolation patterns 114a, 114b and 114b may be formed in the first, second and third trenches 110a, 110b and 110c, respectively. Thus, bottoms and widths of the first, second and third isolation patterns 114a, 114b and 114b may be different from each other.

In some example embodiments, the first isolation pattern 114a may have the first width W1. The second isolation pattern 114b may have the second width W2, and the third isolation pattern 114c may have the third width W3. A distance between the upper surface of the first active pattern 112a and the bottom of the first isolation pattern 114a may be the first depth D1. A distance between the upper surface of the first active pattern 112a and the bottom of the second isolation pattern 14b may be the second depth D2, and a distance between the upper surface of the second active pattern 112b and the bottom of the third isolation pattern 114c may be the third depth D3. Thus, the bottom of the first isolation pattern 114a may be disposed at a relatively low level, and the bottom of the third isolation pattern 114c may be disposed at a relatively high level.

In some example embodiments, the first, second and third isolation patterns 114a, 114b and 114c may completely fill the first, second and third trenches 110a, 110b and 110c, respectively. Alternatively, the first, second and third isolation patterns 114a, 114b and 114c may partially fill the first, second and third trenches 110a, 110b and 110c, respectively.

In some example embodiments, the first, second third isolation patterns 114a, 114b and 114c may include, e.g., silicon oxide, silicon nitride, etc. These may be used alone or in a combination thereof.

As described above, the active pattern array may include at least 4 active patterns. A plurality of trenches 110a, 110b and 110c having different depths and different widths may be formed between the active patterns 112a and 112b.

FIGS. 2 to 9 are cross-sectional views illustrating operations of a method of forming an active pattern structure in accordance with some example embodiments.

Referring to FIG. 2, a first mask layer 102 may be formed on a substrate 100, and a plurality of second masks 104 may be formed on the first mask layer 102.

The second masks 104 may be formed by forming a second mask layer on the first mask layer 102, and patterning the second mask layer through a photolithography process. Each of the second masks 104 may extend in the first direction.

Each of the second masks 104 may have a target critical dimension A, which may be about 3 times a first critical dimension of each of first and second active patterns. Also, a space between the second masks 104 may have a target distance B, which may be about 5 times the first critical dimension.

However, when the second masks 104 are formed on the first mask layer 102 by a real photolithography process, the second masks 104 may not have the accurate target critical dimension A and the accurate target distance B. That is, there may be an error or tolerance in the target critical dimension A and the target distance B of the second masks 104. In some example embodiments, ones of second masks 104 may not have the accurate target critical dimension A and the accurate target distance B on a local area of the substrate 100.

In some example embodiments, a critical dimension of each of the second masks 104 may be about 80% to about 120% of the target critical dimension A. Thus, a distance between the second masks 104 may be about 80% to about 120% of the target distance B.

In FIG. 2, the critical dimension A1 of each of the second masks 104 may be less than the target critical dimension A, and the distance B1 between the second masks 104 may be greater than the target distance B.

Figure 3:
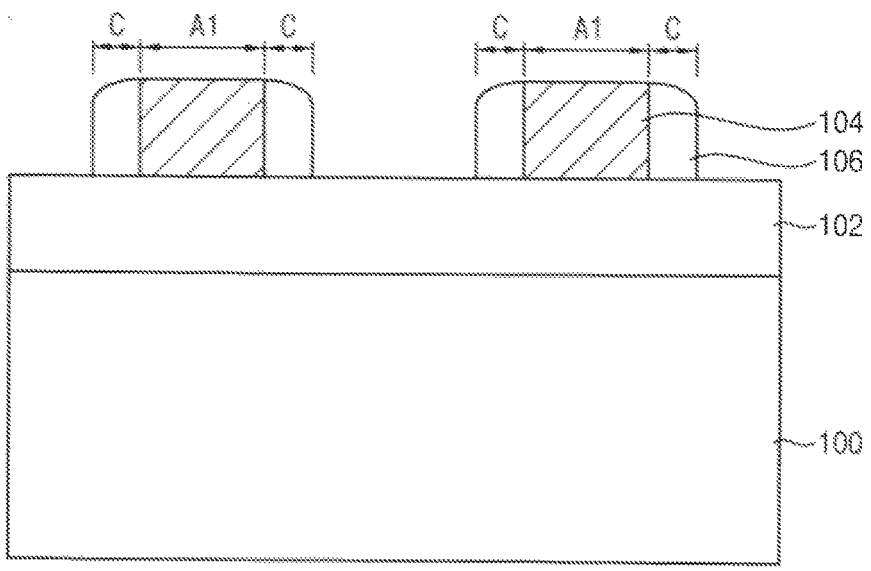

Referring to FIG. 3, a plurality of first spacers 106 may be formed on sidewalls of the second masks 104.

Particularly, a first spacer layer may be conformally formed on the second masks 104 and the first mask layer 102. The first spacer layer may be formed of a material having a high etching selectivity with respect to the first mask layer 102. For example, the first spacer 106 and the first mask layer 102 may be formed of different materials.

The first spacer layer may be formed to have a thickness the same as (or substantially the same as) the first critical dimension C. The first spacer layer may be anisotropically etched to form the first spacers 106. Thus, each of the first spacers 106 may have the first critical dimension C.

Figure 4:
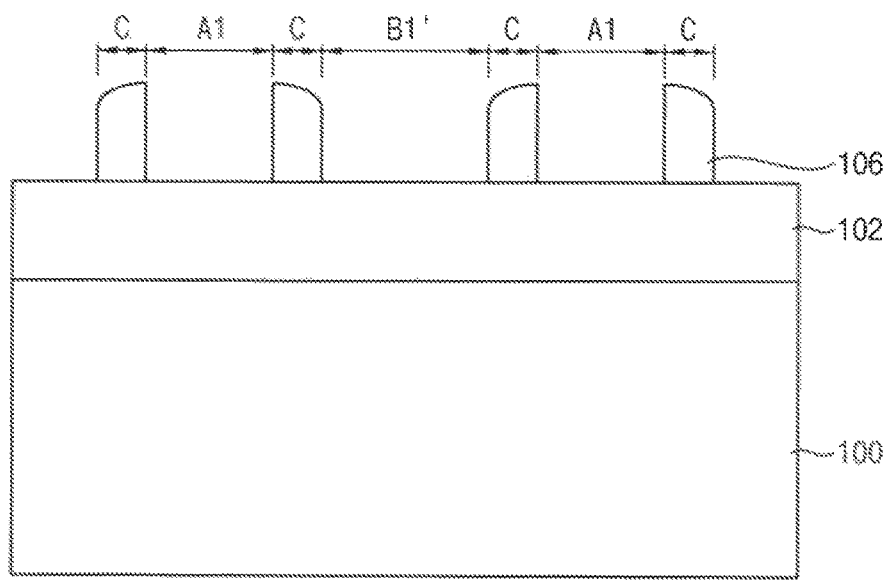

Referring to FIG. 4, the second masks 104 may be removed. Thus, the first spacers 106 may be formed on the first mask layer 102.

The first spacers 106 may be spaced from each other to have various distances. That is, a space formed by removing the second masks 104 may have a preliminary first distance A1. A space between the first spacers 106 formed on sidewalls of the second masks 104 may have a preliminary third distance B1' different from the first preliminary distance A1. For example, the preliminary first distance A1 may be less than about 3 times the first critical dimension C, and the preliminary third distance B1' may be greater than about 3 times the first critical dimension C. Thus, the first spacers 106 may be spaced apart from each other by the preliminary first distance A1 and the preliminary third distance B1', alternately and repeatedly.

Figure 5:
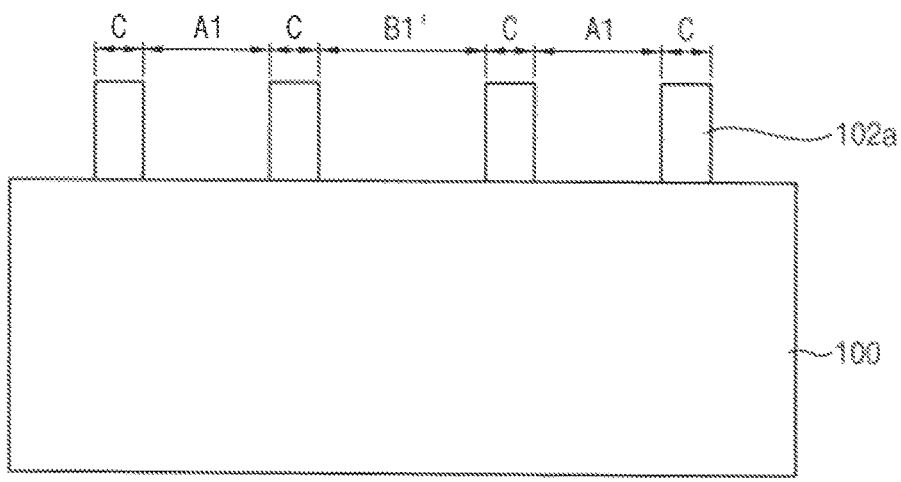

Referring to FIG. 5, the first mask layer 102 may be etched using the first spacers 106 as an etching mask to form a plurality of first masks 102a.

Thus, the first masks 102a may be spaced apart from each other by the preliminary first distance A1 and the preliminary third distance B1', alternately and repeatedly.

Figure 6:
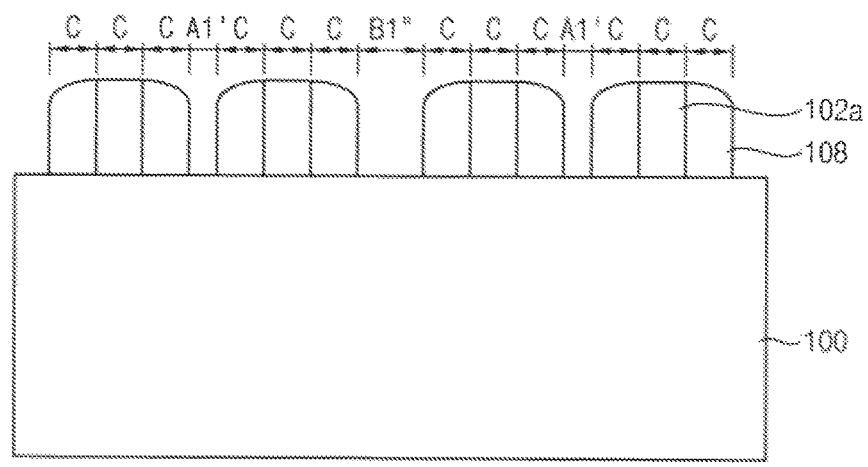

Referring to FIG. 6, a plurality of second spacers 108 may be formed on sidewalls of the first masks 102a.

Particularly, a second spacer layer may be conformally formed on the first masks 102a and the substrate 100. The second spacer layer may be formed of a material having a high etching selectivity with respect to the first mask 102a. Also, the second spacer layer may be formed of a material having a high etching selectivity with respect to the substrate 100.

The second spacer layer may be formed to have a thickness the same as (or substantially the same as) the first critical dimension C. The second spacer layer may be anisotropically etched to form the second spacers 108. Thus, a width of each of the second spacers 108 may have the first critical dimension C.

A space between the second spacers 108 in the space having the preliminary first distance A1 may have a first distance A1'. The first distance A1' may be less than the first critical dimension C. A space between the second spacers 108 in the space having the preliminary third distance B1' may have a third distance B1". The third distance B1" may be greater than the first critical dimension C.

Figure 7:
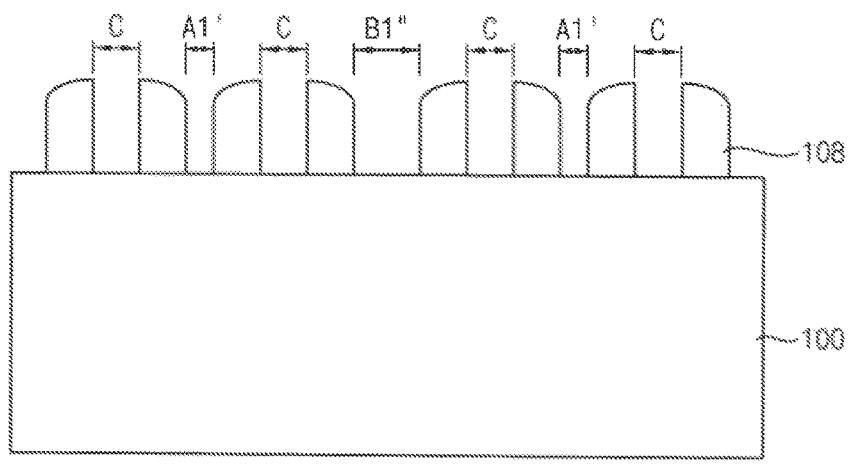

Referring to FIG. 7, the first masks 102a may be removed. Thus, only the second spacers 108 may remain on the substrate 100.

The second spacers 108 may be spaced from each other by various distances.

That is, a space formed by removing the first masks 102a may have a second distance C substantially the same as the first critical dimension C.

Thus, the second spacers 108 may be spaced apart from each other by the second distance C, the first distance A1, the second distance C and the third distance B1" in the second direction.

Figure 8:
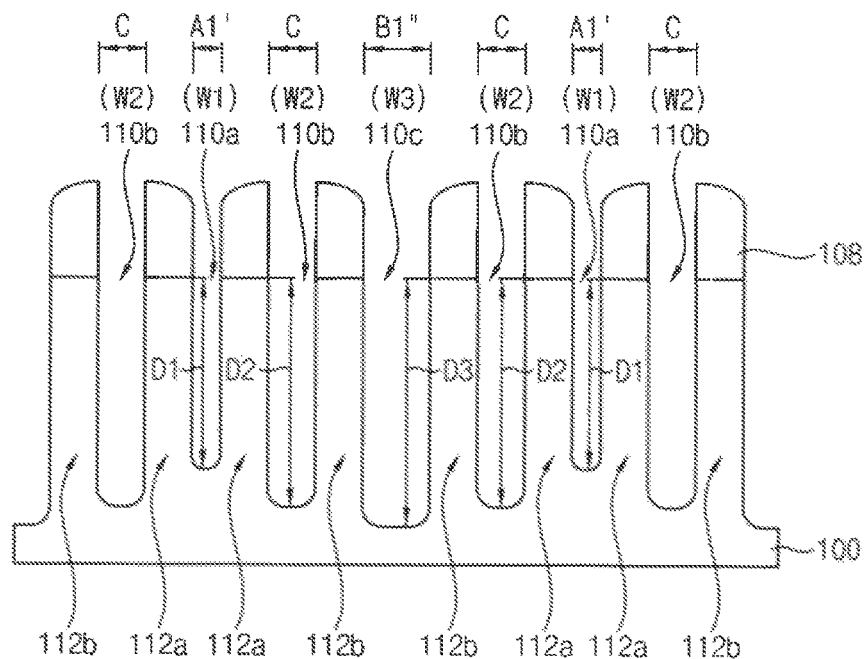

Referring to FIG. 8, the substrate 100 may be anisotropically etched using the second spacers 108 as an etching mask to form a first trench 110a, a second trench 110b, and a third trench 110c. Thus, a first active pattern 112a and a second active pattern 112b may be formed on the substrate 100 by forming the first, second and third trenches 110a, 110b and 110c.

Particularly, portions of the substrate 100 between the second spacers 108 may be anisotropically etched. In the etching process, the first trench 110a may be formed at a portion of the substrate 100 between the second spacers 108 spaced apart from each other by the first distance A1'. The second trench 110b may be formed at a portion of the substrate 100 between the second spacers 108 spaced apart from each other by the second distance C, and the third trench 110c may be formed at a portion of the substrate 100 between the second spacers 108 spaced apart from each other by the third distance B1". In some example embodiments, a bottom of each of the first, second and third trenches 110a, 110b and 110c may have a rounded shape.

The second trench 110b, the first trench 110a, the second trench 110b and the third trench 110c may be sequentially arranged in the second direction. The first trench 110a may have a first width W1 substantially the same as the first distance A1. The second trench 110b may have a second width W2 substantially the same as the second distance C, and the third trench 110c may have a third width W3 substantially the same as the third distance B1".

In some example embodiments, a critical dimension of each of the second masks 104 may be about 80% to about 120% of the target critical dimension A, and may not be same as the target critical dimension A. In this case, the first width W1 may be about 80% to about 100% of the second width W2, and the third width W3 may be about 100% to about 120% of the second width W2.

In the etching process, a micro loading effect may be differently generated depending on the distance between the second spacers 108. Thus, the first, second and third trenches 110a, 110b and 110c may be formed to have different depths from each other.

That is, the first trench 110a may have a relatively small width. Thus, an etching gas may not be easily introduced into a portion of the substrate 100 for forming the first trench 110a, so that an etch rate of the portion of the substrate 100 may be relatively low. The third trench 110c may have a relatively large width. Thus, the etching gas may be easily introduced into a portion of the substrate 100 for forming the third trench 110c, so that an etch rate of the portion of the substrate 100 may be relatively high. Thus, the first trench 110a may be formed to have a first depth D1. The second trench 110b may be formed to have a second depth D2 greater than the first depth D1, and the third trench 110c may be formed to have a third depth D3 greater than the second depth D2. In some example embodiments, the first depth D1 may be about 70% to about 100% of the second depth D2, and the third depth D3 may be about 100% to about 130% of the second depth D2.

As illustrated with reference to FIGS. 1A and 1B, the first and second active patterns 112a and 112b may form an active pattern array.

The active pattern array may include a plurality of active pattern groups Gs (refer to FIGS. 1A and 1B) arranged in the second direction. Each of the active pattern groups Gs may include at least one second active pattern 112b, and at least one first active pattern 112a. The first active pattern 112a and the second active pattern 112b may be sequentially arranged in the second direction. The first and second active patterns 112a and 112b included in the active pattern group G may be symmetric with respect to the first trench 110a between the first active patterns 112a.

Figure 9:
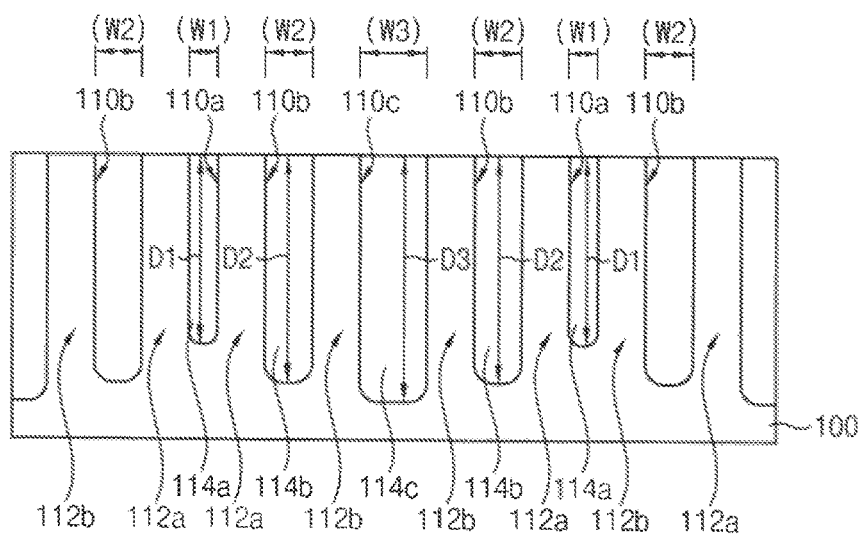

Referring to FIG. 9, a first isolation pattern 114a, a second isolation pattern 114b and a third isolation pattern 114c may be formed in the first, second and third trenches 110a, 110b and 110c, respectively.

The first, second and third isolation patterns 114a, 114b and 114c may have different depths and different widths from each other.

In some example embodiments, the first isolation pattern 114a may have the first width W1. The second isolation pattern 114b may have the second width W2, and the third isolation pattern 114c may have the third width W3. A bottom of the first isolation pattern 114a may be disposed at a relatively high level, and a bottom of the third isolation pattern 114c may be disposed at a relatively low level.

FIGS. 10 to 13 are cross-sectional views illustrating operations of a method of forming an active pattern structure in accordance with some example embodiments.

This method of forming the active pattern structure may include processes substantially the same as or similar to the processes for forming the active patterns illustrated with reference to FIGS. 2 to 9. However, a width of each of the second masks and a distance between the second masks may be different from those illustrated with reference to FIG. 2. The active pattern structure may be substantially the same as the active structure illustrated with reference to FIGS. 1A and 1B.

Figure 10:
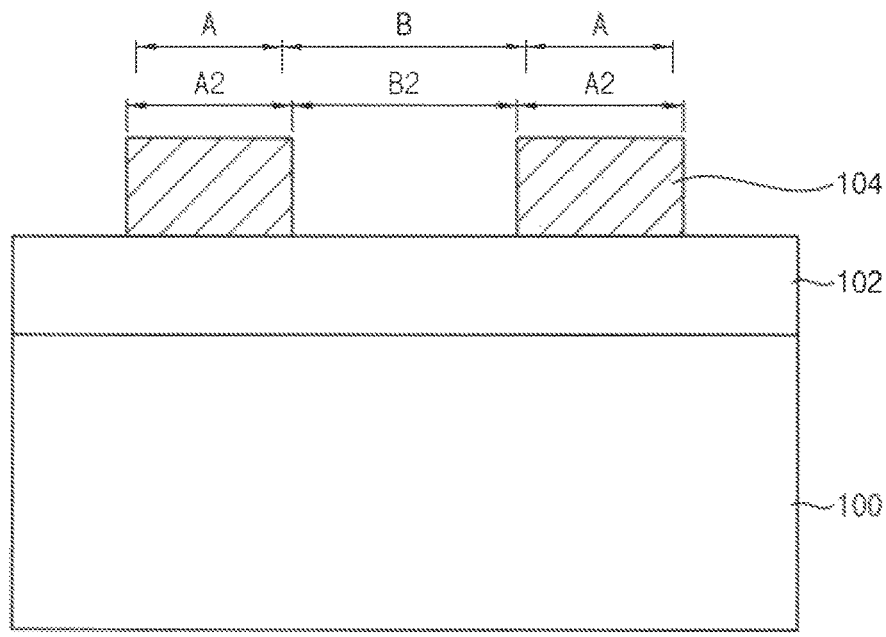

Referring to FIG. 10, the first mask layer 102 may be formed on the substrate 100. A plurality of second masks 104 may be formed on the first mask layer 102. The second masks 104 may be formed by performing the process illustrated with reference to FIG. 2.

In some example embodiments, as shown in FIG. 10, the critical dimension A2 of each of the second masks 104 may be greater than the target critical dimension A, and the distance B2 between the second masks 104 may be less than the target distance B.

Figure 11:
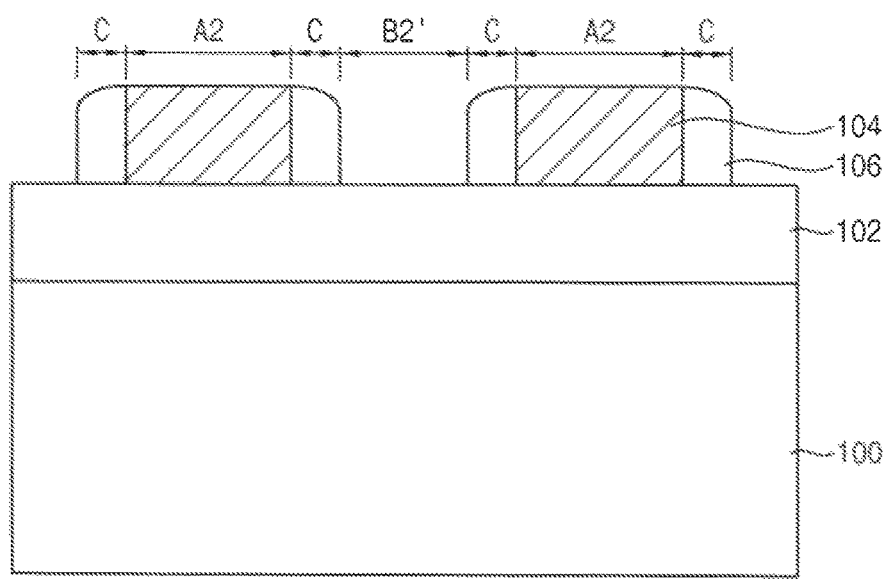

Referring to FIG. 11, a plurality of first spacers 106 may be formed on sidewalls of the second masks 104. The first spacers 106 may be formed by performing the process illustrated with reference to FIG. 3. Each of the first spacers 106 may be formed to have the first critical dimension C.

Figure 12:
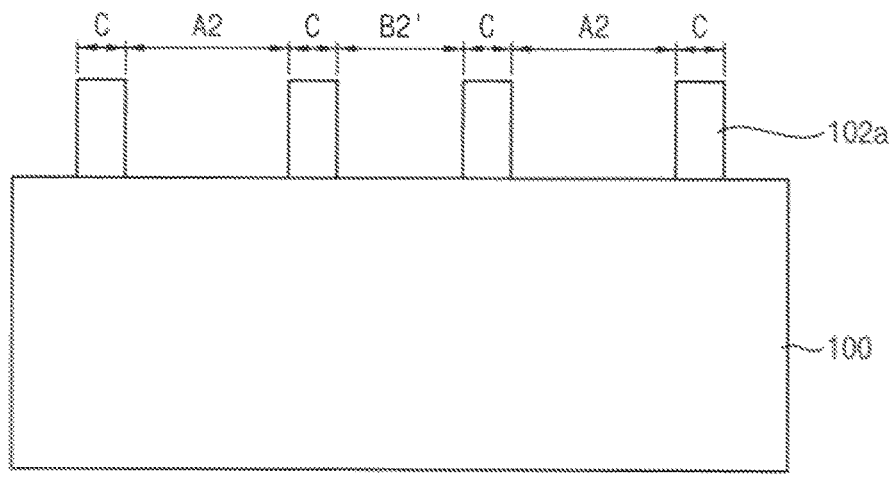

Referring to FIG. 12, the second masks 104 may be removed. The first mask layer 102 may be etched using the first spacers 106 as an etching mask to form a plurality of first masks 102a.

The processes may be substantially the same as the processes illustrated with reference to FIGS. 4 and 5. The first masks 102a may be spaced apart from each other by the preliminary third distance A2 and the preliminary first distance B2', alternately and repeatedly. The preliminary third distance A2 may be greater than the preliminary first distance B2'.

Figure 13:
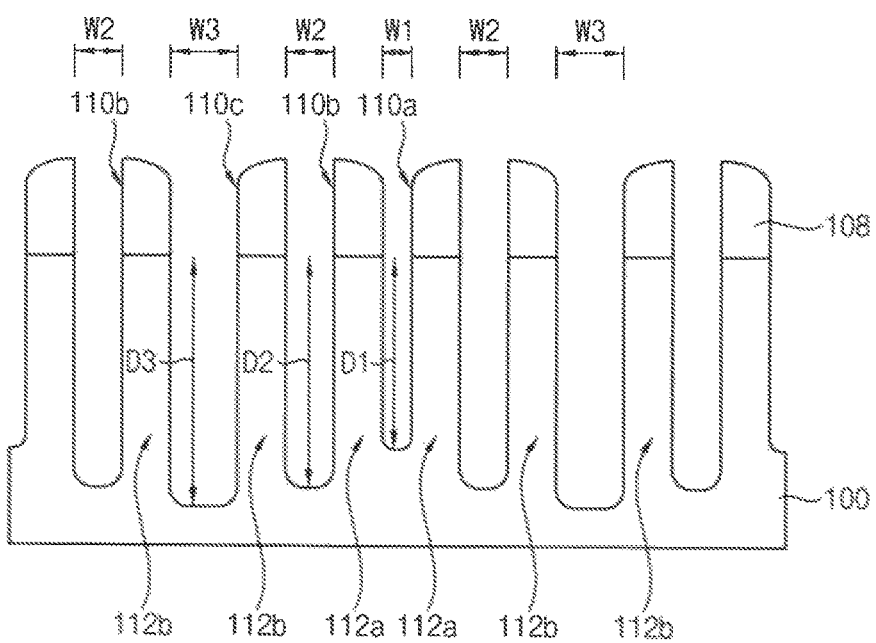

Referring to FIG. 13, a plurality of second spacers 108 may be formed on sidewalls of the first masks 102a. Each of the second spacers 108 may be formed to have the first critical dimension C. The first masks 102a may be removed. The substrate 100 may be etched using the second spacers 108 as an etching mask to form a first trench 110a, a second trench 110b and a third trench 110c. Thus, a first active pattern 112a and a second active pattern 112b may be formed on the substrate 100 by forming the first, second and third trenches 110a, 110b and 110c.

The processes may be substantially the same as the processes illustrated with reference to FIGS. 6 to 8. The first, second and third trenches 110a, 110b and 110c and the first and second active patterns 112a and 112b may be disposed with the same regularity as illustrated with reference to FIG. 8.

Referring to FIGS. 1A and 1B again, a first isolation pattern 114a, a second isolation pattern 114b and a third isolation pattern 114c may be formed in the first, second and third trenches 110a, 110b and 110c, respectively. The processes may be substantially the same as the processes illustrated with reference to FIG. 9.

FIGS. 14 to 22 are cross-sectional views illustrating operations of a method of manufacturing a semiconductor device in accordance with some example embodiments.

The semiconductor device may include a fin-field effect transistor (FET).

Figure 14:
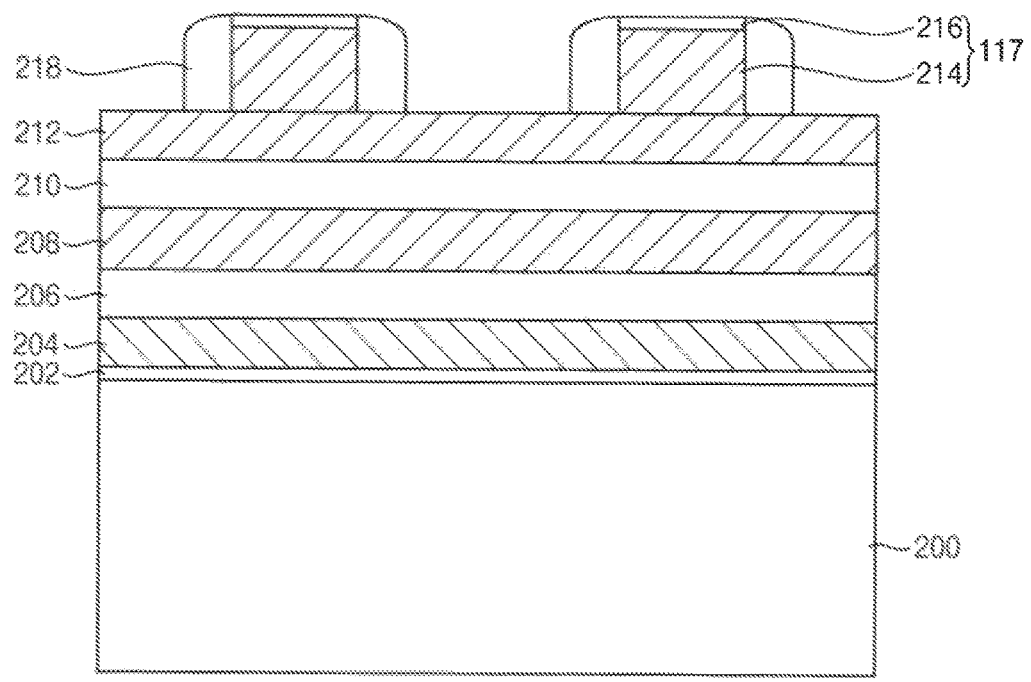

Referring to FIG. 14, a pad insulation layer 202, a first mask layer 204, a second mask layer 206, a third mask layer 208, a fourth mask layer 210 and a fifth mask layer 212 may be sequentially formed on a substrate 200. A plurality of sixth masks 117 may be formed on the fifth mask layer 212. A plurality of first spacers 218 may be formed on sidewalls of the sixth masks 117.

The pad insulation layer 202 may be formed of, e.g., silicon oxide. The pad insulation layer 202 may be formed by a thermal oxidation process, a chemical vapor deposition (CVD) process or an atomic layer deposition (ALD) process.

The first mask layer 204 may be formed of, e.g., silicon nitride or silicon oxynitride. The second mask layer 206 may be formed of, e.g., silicon oxide. The third mask layer 208 may be formed of, e.g., polysilicon. The fourth mask layer 210 may be formed of, e.g., amorphous carbon. The fifth mask layer 212 may be formed of, e.g., silicon oxynitride or silicon nitride.

Each of the third, fourth and fifth mask layers 208, 210 and 212 may be formed of a material having a high etching selectivity with respect to silicon oxide. Each of the first and second mask layers 204 and 206 may be formed of a material having a high etching selectivity with respect to silicon.

The sixth masks 117 may include a spin-on hardmask (SOH) pattern 214 and a silicon oxynitride pattern 216 sequentially stacked. In some example embodiments, the sixth masks 117 may be formed by coating the SOH layer, forming a silicon oxynitride layer on the SOH layer, and patterning the silicon oxynitride layer and the SOH layer by photolithography process.

The sixth masks 117 may extend in the first direction.

Each of the sixth masks 117 may have a target critical dimension, which may be about 3 times a first critical dimension of each of first and second active patterns. Also, a space between the sixth masks 117 may have a target distance, which may be about 5 times the first critical dimension. However, when the sixth masks 117 are formed on the fifth mask layer 212 by a real photolithography process, each of the sixth masks 117 may not have an accurate target critical dimension and an accurate target distance.

In some example embodiments, the sixth masks 117 may have widths and distances substantially the same as the widths and the distances of the second masks illustrated with reference to FIG. 2, respectively. Alternatively, the sixth masks 117 may have widths and distances substantially the same as the widths and the distances of the second masks illustrated with reference to FIG. 10, respectively.

The first spacers 218 may be formed by conformally forming a first spacer layer on the sixth masks 117 and the fifth mask layer 212, and anisotropically etching the first spacer layer. In some example embodiments, the first spacer layer may be formed of silicon oxide by a CVD process. The first spacer layer may be formed to have a uniform thickness.

The first spacer layer may be formed to have a thickness substantially the same as a thickness of the first critical dimension. Thus, each of the first spacers 218 may have the first critical dimension. In some example embodiments, each of the first spacers 218 may have a critical dimension greater than 0 nm and less than about 20 nm. In this case, each of the first and second active patterns may be formed to have a critical dimension less than about 20 nm by performing subsequent processes.

Figure 15:
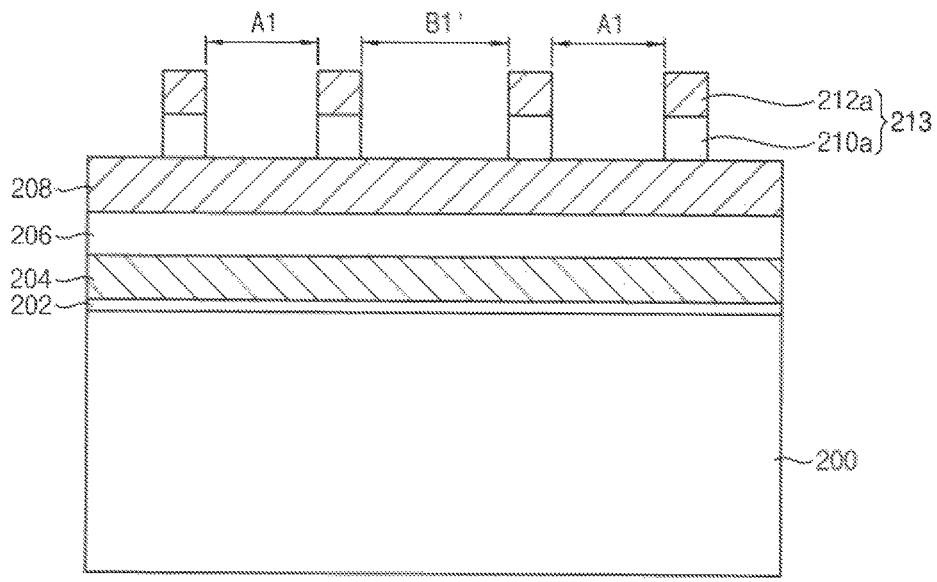

Referring to FIG. 15, the sixth masks 117 may be removed. Thus, only the first spacers 218 may remain on the fifth mask layer 212.

The first spacers 218 may be spaced apart from each other by the preliminary first distance A1 and the preliminary third distance B1', alternately and repeatedly. For example, the preliminary first distance A1 may be less than about 3 times the first critical dimension, and the preliminary third distance B1' may be greater than about 3 times the first critical dimension.

In some example embodiments, the first spacers 218 may be spaced apart from each other with the same regularity as an arrangement of the first spacers illustrated with reference to FIG. 4.

The fifth mask layer 212 and the fourth mask layer 210 may be sequentially and anisotropically etched using the first spacers 218 as an etching mask. Thus, a plurality of first structures 213 may be formed on the third mask layer 208. Each of the first structures 213 may include a fourth mask 210a and fifth mask 212a sequentially stacked.

The first structures 213 may be spaced apart from each other by a distance substantially the same as the distance between the first spacers 218. During the etching process, the first spacers 218 may be mostly removed.

Figure 16:
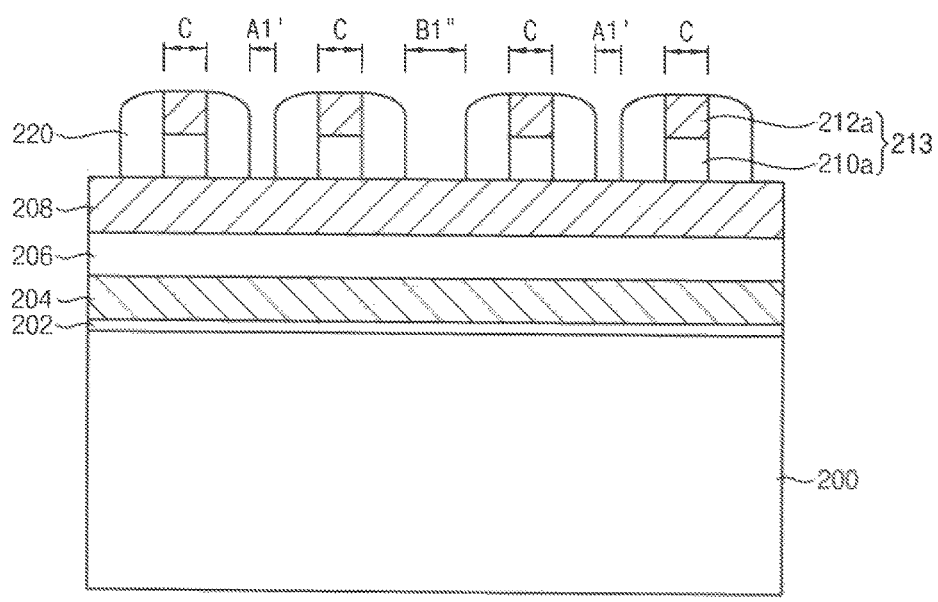

Referring to FIG. 16, a second spacer layer may be conformally formed on the first structures 213 and the third mask layer 208. The second spacer layer may be anisotropically etched to form a plurality of second spacers 220. In some example embodiments, the second spacer layer may be formed of, e.g., silicon oxide by an ALD process.

The second spacer layer may be formed to have a thickness substantially the same as the first critical dimension. Thus, each of the second spacers 220 may have a width substantially the same as the first critical dimension.

Figure 17:
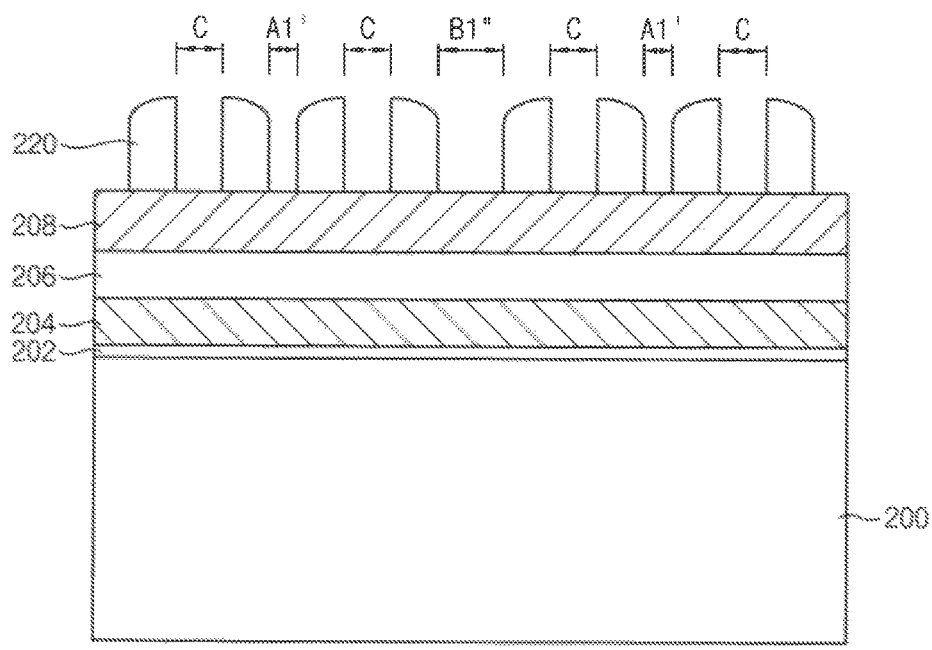

Referring to FIG. 17, the first structures 213 may be removed. Thus, only the second spacers 220 may remain on the third mask layer 208.

The second spacers 220 may be spaced apart from each other by different distances. In some example embodiments, the second spacers 220 may be spaced apart from each other by the second distance C, the first distance A1', the second distance C and the third distance B1' as illustrated with reference to FIGS. 7 and 17. The first distance A1 may be less than the second distance C, and the third distance B1' may be greater than the second distance C.

Figure 18:
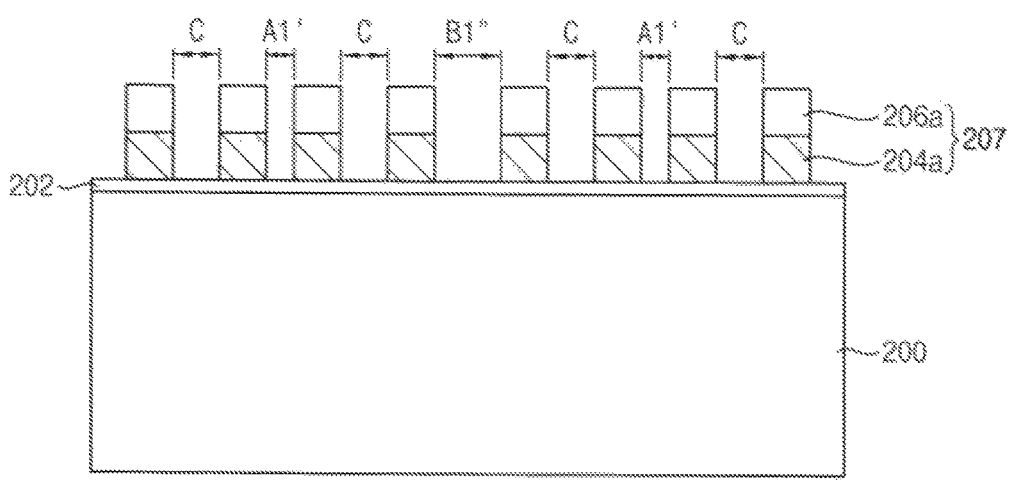

Referring to FIG. 18, the third mask layer 208 may be anisotropically etched using the second spacers 220 as an etching mask to form a plurality of third masks. The second mask layer 206 and the first mask layer 204 may be anisotropically etched using the third masks as an etching mask to form a plurality of second structures 207. Each of the second structures 207 may include a first mask 204a and a second mask 206a sequentially stacked. During the etching process for forming the second structures 207, the third masks may be mostly removed.

The second structures 207 may be spaced apart from each other by distances substantially the same as the distances between the second spacers 220. In some example embodiments, the second structures 207 may be spaced apart from each other by the second distance, the first distance, the second distance and the third distance in this order.

Figure 19:
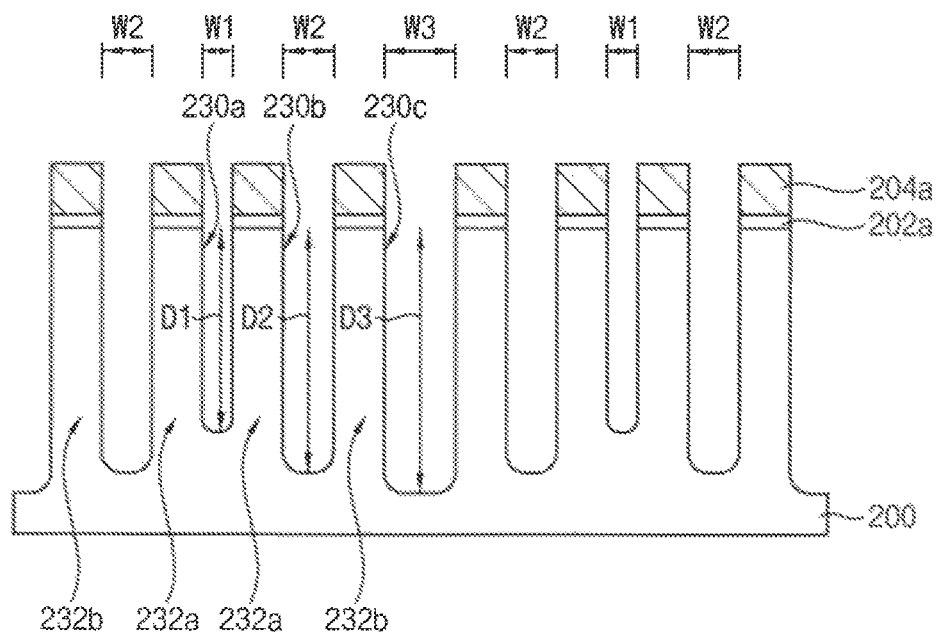

Referring to FIG. 19, the pad insulation layer 202 and the substrate 100 may be anisotropically etched using the second structures 207 as an etching mask to form a first trench 230a, a second trench 230b and a third trench 230c. Thus, a first active pattern 232a and a second active pattern 232b may be formed on the substrate 200 by forming the first, second and third trenches 230a, 230b and 230c.

Particularly, portions of the substrate 200 between the second structures 207 may be anisotropically etched. In the etching process, the first trench 230a may be formed at a portion of the substrate 100 between the second structures 207 spaced apart from each other by the first distance. The second trench 230b may be formed at a portion of the substrate 100 between the second structures 207 spaced apart from each other by the second distance, and the third trench 203c may be formed at a portion of the substrate 100 between the second structures 207 spaced apart from each other by the third distance.

Arrangements and shapes of the first, second and third trenches 230a, 230b and 230c and the first and second active patterns 232a and 232b may be substantially the same as those illustrated with reference to FIG. 8.

The first trench 230a may have a first width W1 substantially the same as the first distance A1'. The second trench 230b may have a second width W2 substantially the same as the second distance C, and the third trench 230c may have a third width W3 substantially the same as the third distance B1". The first trench 230a may have a first depth D1. The second trench 230b may have a second depth D2 greater than the first depth D1, and the third trench 230c may have a third depth D3 greater than the second depth D2.'

The first and second active patterns 232a and 232b may form an active pattern array. The active pattern array may include a plurality of active pattern groups arranged in the second direction. Each of the active pattern groups may include the second active pattern 232b, the first active pattern 232a, the first active pattern 232a and the second active pattern 232b sequentially arranged in the second direction. The first and second active patterns 232a and 232b included in the active pattern group may be symmetric with respect to the first trench 230a between the first active patterns 232a.

During the etching process, the second masks 206a may be mostly removed.

Figure 20:
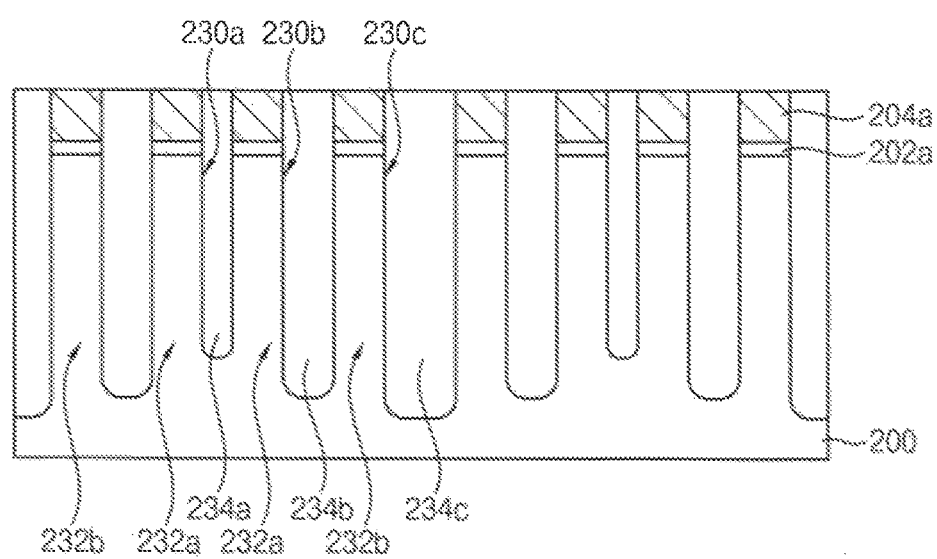

Referring to FIG. 20, a preliminary first isolation pattern 234a, a preliminary second isolation pattern 234b and a preliminary third isolation pattern 234c may be formed to fill the first trench 230a, the second trench 230b and the third trench 230c, respectively.

Particularly, an insulation layer may be formed on the first masks 204a to fill the first, second and third trenches 230a, 230b and 230c. The insulation layer may be formed of, e.g., silicon oxide. The isolation layer may be formed by an ALD process, a CVD process, a spin coating process, etc.

The insulation layer may be planarized until an upper surface of the first masks 204a may be exposed to form the preliminary first isolation pattern 234a, the preliminary second isolation pattern 234b and the preliminary third isolation pattern 234c. The planarization process may include a chemical mechanical polishing (CMP) process.

Figure 21:
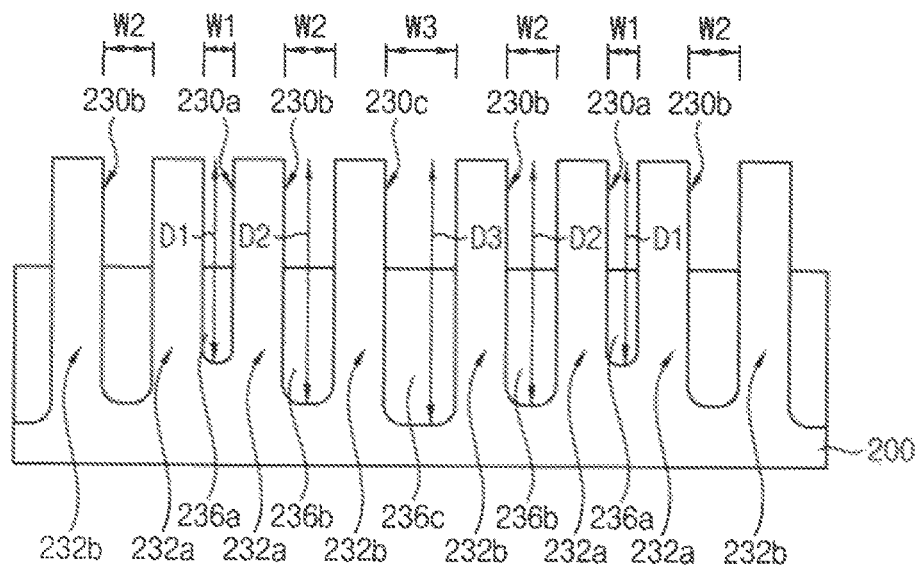

Referring to FIG. 21, upper portions of the preliminary first isolation pattern 234a, the preliminary second isolation pattern 234b and the preliminary third isolation pattern 234c may be etched to form a first isolation pattern 236a, a second isolation pattern 236b and a third isolation pattern 236c, respectively. Thus, upper sidewalls of the first, second and third trenches 230a, 230b and 230c may be exposed.

The first masks 204a and the pad insulation layer 202 may be removed.

Thus, the upper sidewalls and upper surfaces of the first and second active patterns 232a and 232b may be exposed.

The exposed portions of the first and second active patterns 232a and 232b may serve as an active region.

Figure 22:
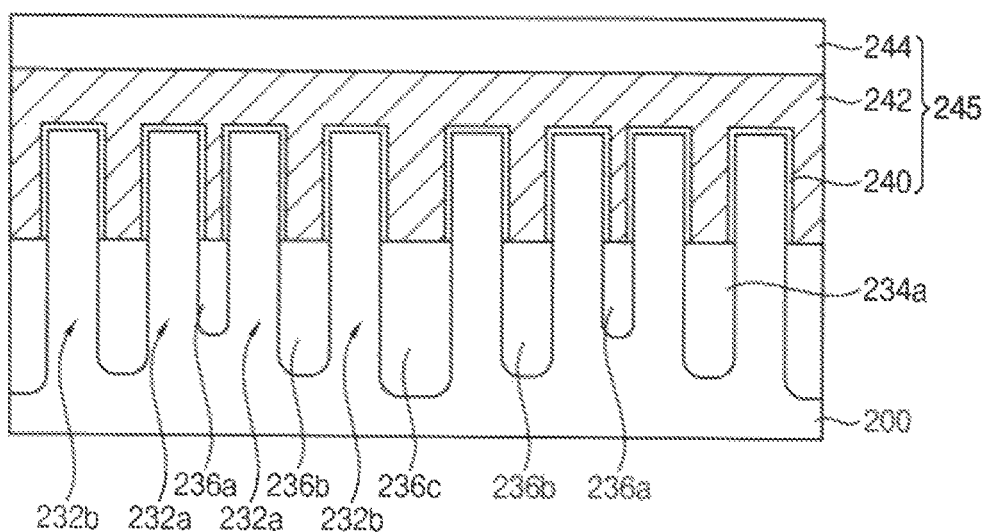

Referring to FIG. 22, a gate structure 245 may be formed on the active region and the first, second and third isolation patterns 236a, 236b and 236c. The gate structure 245 may include a gate insulation layer 240, a gate electrode 242 and a hard mask 244 sequentially stacked.

In some example embodiments, the gate insulation layer 240 may be on a surface of the active region. The gate electrode 242 and the hard mask 244 may be formed on the gate insulation layer 240. The gate structure 245 may extend in the second direction.

In some example embodiments, the gate insulation layer 240 may include, e.g., silicon oxide and the gate electrode 242 may include, e.g., polysilicon. Alternatively the gate insulation layer 240 may have a stacked structure including a thermal oxidation layer and a metal oxide layer having a high dielectric constant. The metal oxide layer may be formed of, e.g., hafnium oxide ($HfO_2$), tantalum oxide ($Ta_2O_5$), zirconium oxide ($ZrO_2$), etc. The gate electrode 242 may be formed of a metal, e.g., aluminum (Al), copper (Cu), tantalum (Ta), or a nitride thereof.

As described above, the finFET may be formed on the active pattern array including the first and second active patterns 232a and 232b.

Widths of the first and second active patterns 232a and 232b may be substantially the same as each other. The first, second and third isolation patterns 236a, 236b and 236c may be formed between the first and second active patterns 232a and 232b, and may have different depths and different widths from each other.

The widths and the distances of the first, second and third isolation patterns 236a, 236b and 236c may be substantially the same as those illustrated with reference to FIGS. 1A and 1B, respectively. Arrangements of the first and second active patterns 232a and 232b may be substantially the same as those illustrated with reference to FIGS. 1A and 1B.

Top surfaces of the first, second and third isolation patterns 236a, 236b and 236c may be lower than top surfaces of the first and second active patterns 232a and 232b. A bottom of the first isolation pattern 236a may be disposed at a relatively high level, and a bottom of the third isolation pattern 236c may be disposed at a relatively low level.

FIGS. 23 to 26 are cross-sectional views illustrating operations of a method of manufacturing a semiconductor device in accordance with some example embodiments.

The semiconductor device may include a multi-channel transistor.

Figure 23:
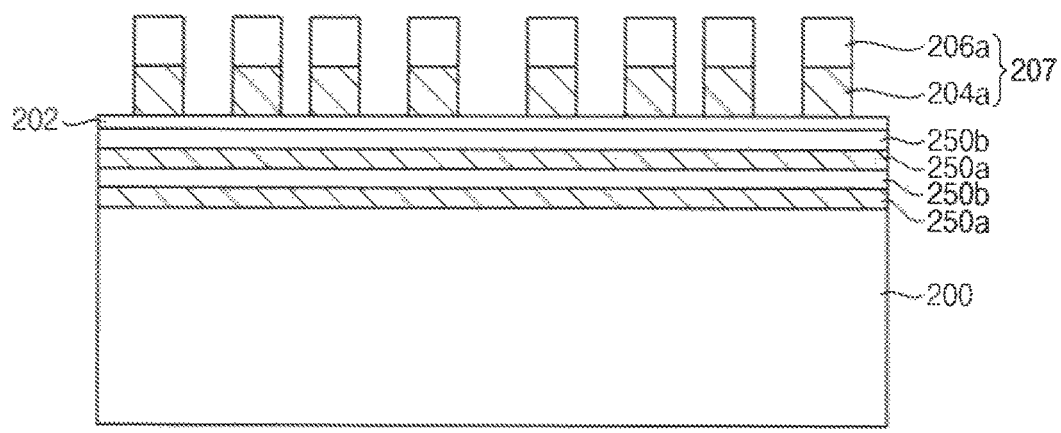

Referring to FIG. 23, first semiconductor layers 250a and second semiconductor layers 250b may be alternatively and repeatedly formed on a substrate 200 to form a semiconductor structure.

A gate pattern may be subsequently formed in the first semiconductor layers 250a, and channels of the transistor may be subsequently formed in the second semiconductor layers 250b.

The first and second semiconductor layers 250a and 250b may include crystalline semiconductor materials having high etching selectivities with respect to each other. In some example embodiments, the first semiconductor layers 250a may be formed of, e.g., single crystalline silicon germanium, and the second semiconductor layers 250b may be formed of, e.g., single crystalline silicon. The first and second semiconductor layers 250a and 250b may be formed by an epitaxial growth process. In some example embodiments, when each of the second semiconductor layers 250b is formed, impurities may be doped into each of the second semiconductor layers 250b in-situ. Thus, the channels of the transistor may be doped with the impurities.

Processes illustrated with reference to FIGS. 14 and 18 may be performed on an uppermost second semiconductor layer 250b. Thus, a pad insulation layer 202 may be formed on the uppermost second semiconductor layer 250b. A plurality of second structures 207 may be formed on the pad insulation layer 202. Each of the second structures 207 may include a first mask 204a and a second mask 206a stacked.

Figure 24:
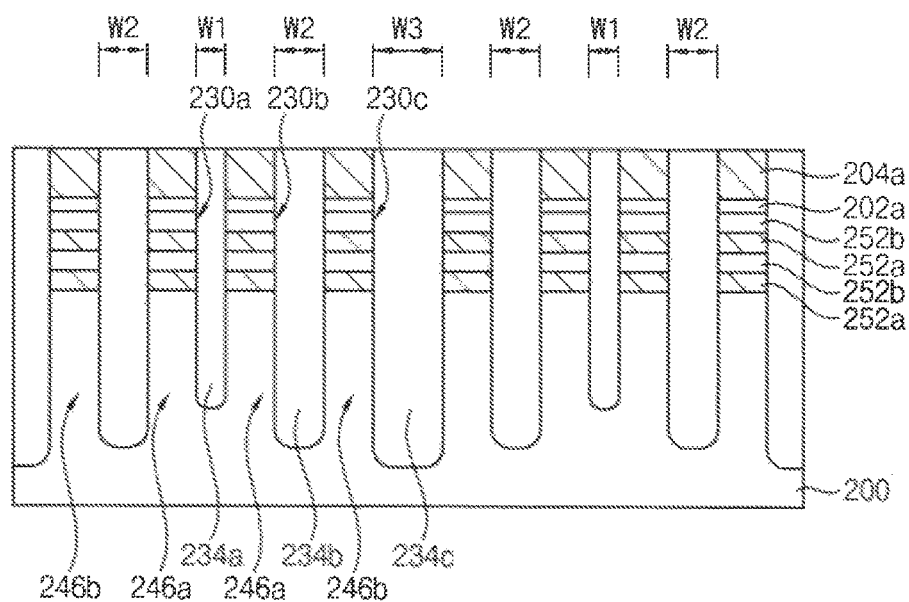

Referring to FIG. 24, the pad insulation layer 202, the first and second semiconductor layers 250a and 250b, and the substrate 200 may be anisotropically etched using the second structures 207 as an etching mask to form a first trench 230a, a second trench 230b and a third trench 230c. Thus, a preliminary first active pattern 246a and a second preliminary active pattern 246b may be formed on the substrate 200 by forming the first, second and third trenches 230a, 230b and 230c. A plurality of first semiconductor patterns 252a and a plurality of second semiconductor patterns 252b may be included in each of the preliminary first and preliminary second semiconductor patterns 246a and 246b.

A preliminary first isolation pattern 234a, a preliminary second isolation pattern 234b and a preliminary third isolation pattern 234c may be formed in the first trench 230a, the second trench 230b and the third trench 230c, respectively.

The processes may be substantially the same as the processes illustrated with reference to FIGS. 19 and 20.

Figure 25:
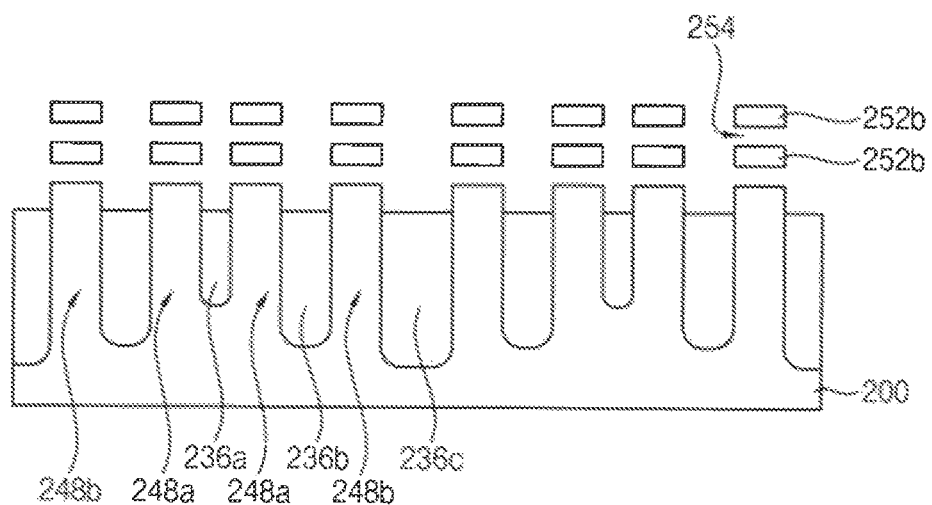

Referring to FIG. 25, upper portions of the preliminary first isolation pattern 234a, the preliminary second isolation pattern 234b, and the preliminary third isolation pattern 234c may be etched to form a first isolation pattern 236a, a second isolation pattern 236b and a third isolation pattern 236c, respectively. The first and second semiconductor patterns 252a and 252b may be exposed at upper sidewalls of the first, second and third trenches 230a, 230b and 230c above the first, second and third isolation patterns 236a, 236b and 236c.

The first masks 204a and the pad insulation layer 202 may be removed.

A portion of the first semiconductor pattern 252a for forming a gate structure may be selectively removed. Thus, the preliminary first active pattern 246a and the preliminary second active pattern 246b may be transformed into a first active pattern 248a and a second active pattern 248b respectively. Each of the first and second active patterns 148a and 148b may include a plurality of tunnels 254 between the second semiconductor patterns 252b.

Figure 26:
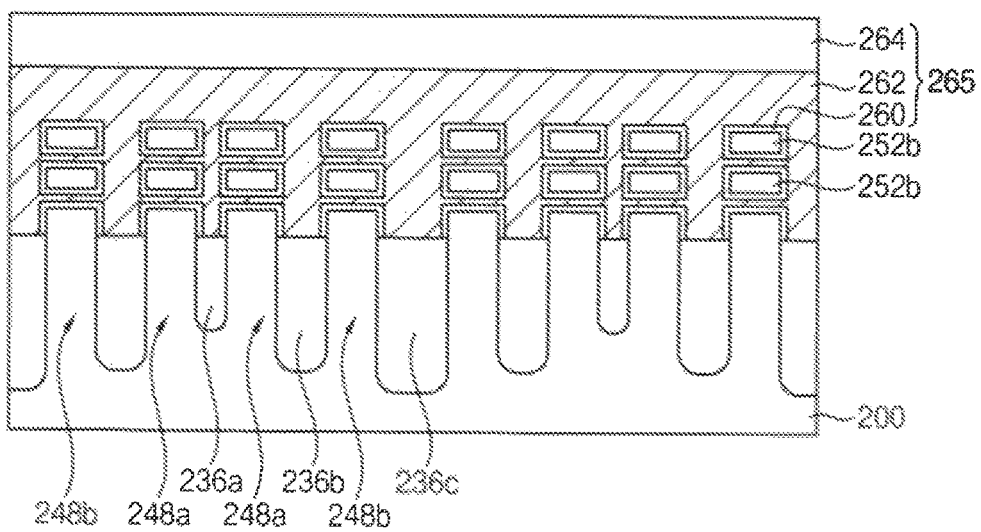

Referring to FIG. 26, a gate structure 265 may be formed on the first and second active patterns 248a and 248b, and the first, second and third isolation patterns 236a, 236b and 236c to fill the tunnels 254. The gate structure 265 may include a gate insulation layer 260, a gate electrode 262 and a hard mask 264.

In some example embodiments, the gate insulation layer 260 may be formed on exposed surfaces of the first and second active patterns 248a and 248b and an exposed surface of the second semiconductor pattern 252b. The gate electrode 262 may be formed on the gate insulation layer 260. The gate electrode 262 may be formed to fill the tunnels 254. The hard mask 264 may be formed on an upper surface of the gate electrode 262. The gate structure 265 may extend in the second direction.

Thus, a multi-channel transistor may be formed.

The multi-channel transistor may include the first and second active patterns 248a and 248b including the tunnels 254. Widths of the first and second active patterns 248a and 248b may be substantially the same as each other. The first, second and third isolation patterns 236a, 236b and 236c may be formed between the first and second active patterns, and widths and depths of the first, second and third isolation patterns 236a, 236b and 236c may be different from each other.

The width and distance of each of the first, second and third isolation patterns 236a, 236b and 236c may be substantially the same as those illustrated with reference to FIGS. 1A and 1B, respectively.

Upper surfaces of the first, second and third isolation patterns 236a, 236b and 236c may be lower than upper surfaces of the first and second active patterns 248a and 248b. A bottom of the first isolation pattern 236a may be disposed at a relatively high level, and a bottom of the third isolation pattern 236c may be disposed at a relatively low level.

FIGS. 27 to 32 are plan views and cross-sectional views illustrating operations of a method of forming an active pattern structure in accordance with some example embodiments.

The semiconductor device may include an active pattern in a DRAM device.

First, processes illustrated with reference to FIGS. 14 and 20 may be performed to form a structure shown in FIG. 20.

Figure 27:
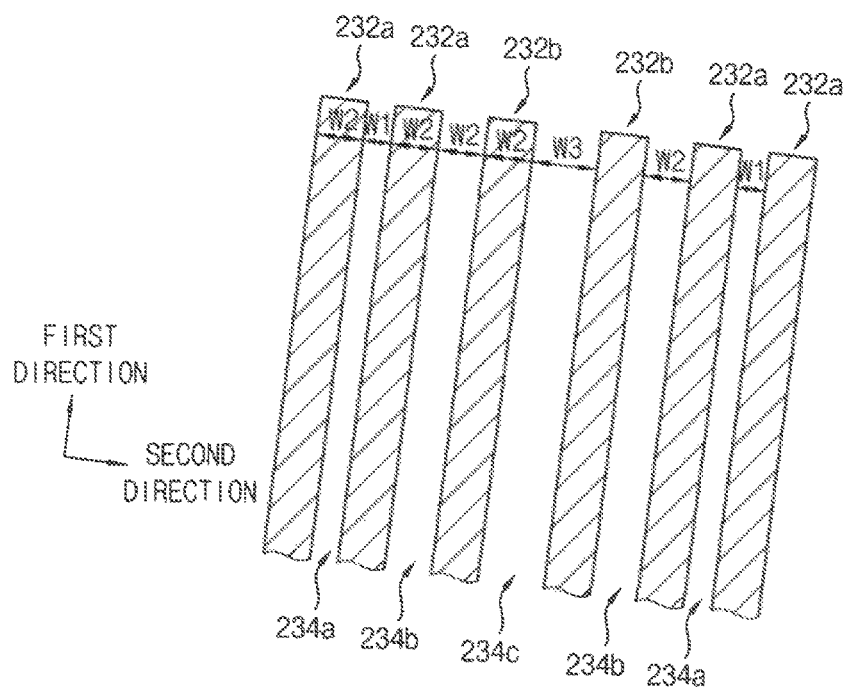

In some example embodiments, referring to FIG. 27, each of the first and second active patterns 232a and 232b may extend in a first direction, which may have an acute angle with respect to an extension direction of a word line.

Figure 28:
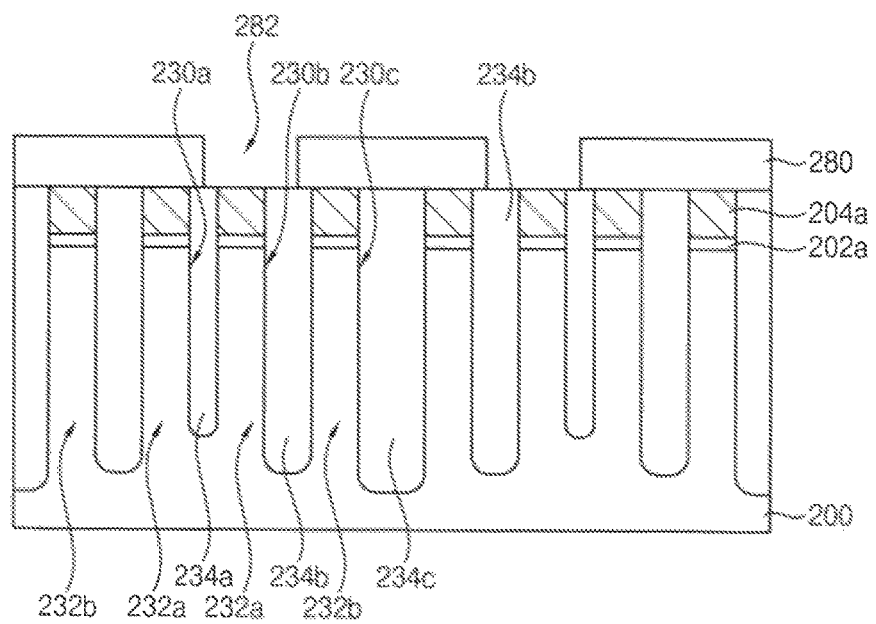
Figure 29:
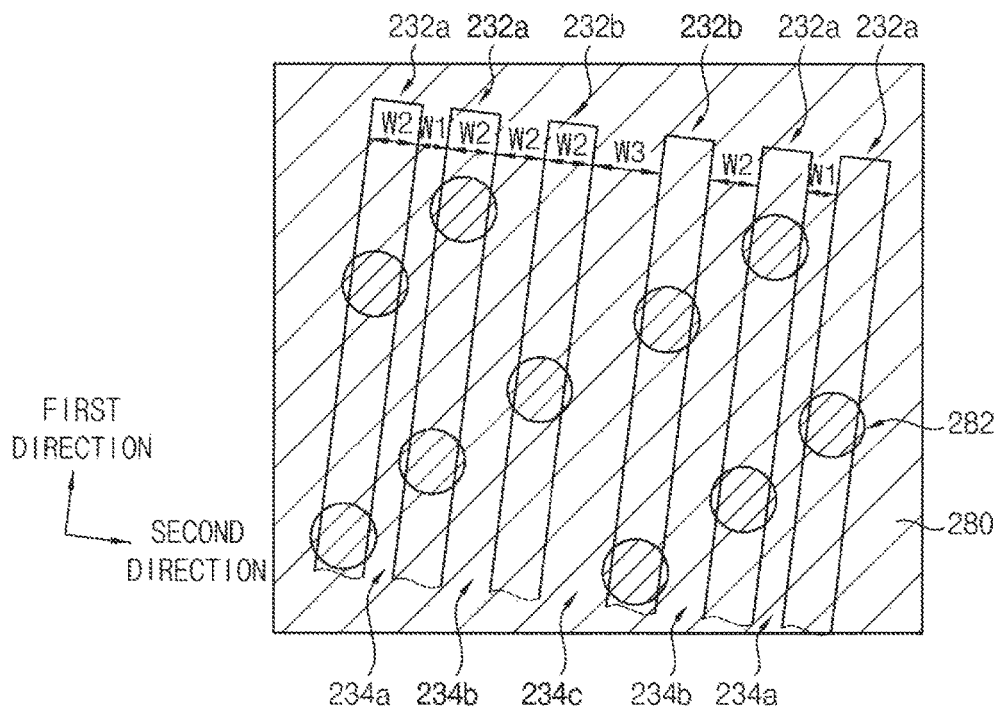

Referring to FIGS. 28 and 29, a seventh mask layer may be formed on the preliminary first isolation pattern 234a, the preliminary second isolation pattern 234b, the preliminary third isolation pattern 234c, and the first masks 204a, and the seventh mask layer may be patterned to form a seventh mask 280.

In some example embodiments, the seventh mask 280 may include holes 282 exposing portions of the first and second active patterns 232a and 232b.

Figure 30:
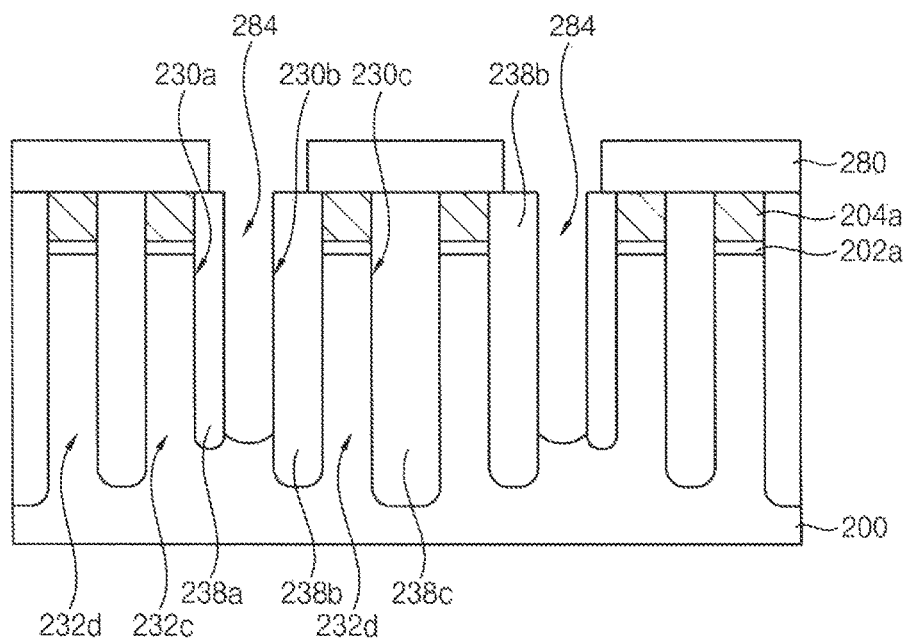

Referring to FIG. 30, the first and second active patterns 232a and 232b may be anisotropically etched using the seventh mask 280 as an etching mask to form a plurality of openings 284. Thus, each of the first active patterns 232a may be cut to form a plurality of third active patterns 232c arranged in the first direction. Each of the second active patterns 232b may be cut to form a plurality of fourth active patterns 232d arranged in the first direction.

Figure 31:
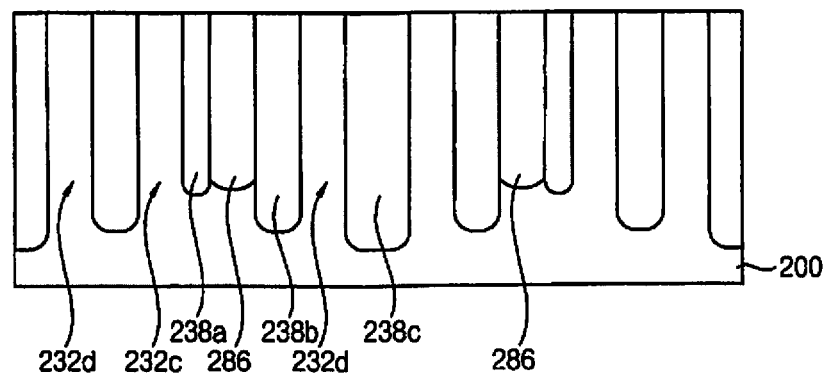
Figure 32:
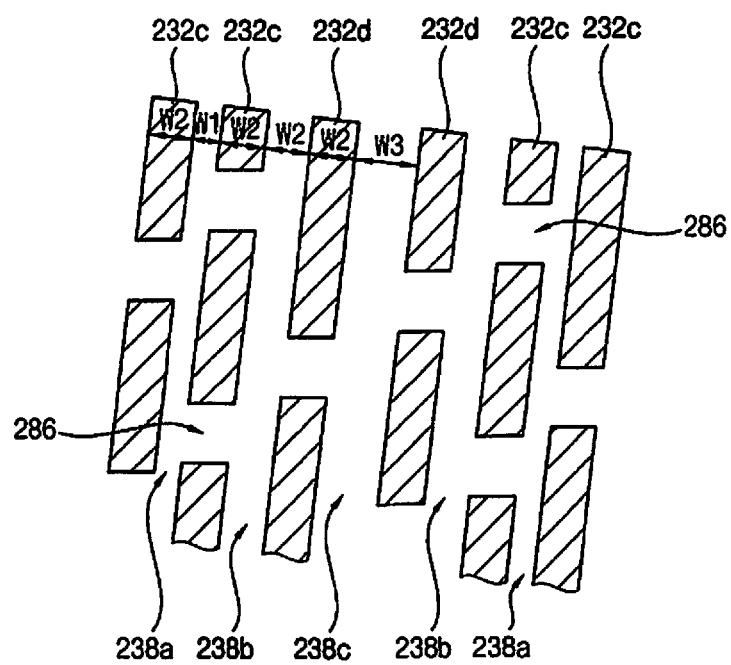

Referring to FIGS. 31 and 32, an insulation layer may be formed to fill the openings 284. The insulation layer may be planarized to form an insulation pattern 286. The insulation pattern 286 may have a material substantially the same as a material of the first, second and third isolation patterns 236a, 236b, and 236c. In some example embodiments the first, second and third isolation patterns 236a, 236b and 236c, the pad insulation layer 202a, and the first masks 204a may be removed. In some example embodiments, upper surfaces of the third and fourth active patterns, and the first, second and third isolation patterns may be substantially coplanar with each other.

In a cross-sectional view of the third and fourth active patterns 232c and 232d taken along the second direction, the first, second and third isolation patterns 236a, 236b and 236c may be formed between the third and fourth active patterns 232c and 232d.

In some example embodiments, a DRAM device may be formed on the third and fourth active patterns 232c and 232d.

As described above, widths of the third and fourth active patterns 232c and 232d may be substantially the same as each other. The first, second and third isolation patterns 238a, 238b and 238c may be formed between the third and fourth active patterns 232c and 232d, and may have different depths and different widths from each other.

The widths and the distances of the first, second and third isolation patterns 238a, 238b and 238c may be substantially the same as those illustrated with reference to FIGS. 1A and 1B, respectively. A bottom of the first isolation pattern 238a may be disposed at a relatively high level, and a bottom of the third isolation pattern 238c may be disposed at a relatively low level.

In some example embodiments, transistors of various types may be formed on an active pattern structure. For example, the transistors may include a vertical channel transistor, a buried channel transistor, a nano-wire transistor, a gate-all-around (GAA) type transistor, etc.

The foregoing is illustrative of example embodiments and is not to be construed as limiting thereof. Although a few example embodiments have been described, those skilled in the art will readily appreciate that many modifications are possible without materially departing from the novel teachings and features of example embodiments. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An active pattern structure of a semiconductor device, comprising:
    a substrate including an active pattern array defined by a plurality of trenches in the substrate,
    the active pattern array including a plurality of first and second active patterns, each of the first and second active patterns extending in a first direction,
    the active pattern array including an active pattern group, the active pattern group including one of the first active patterns and one of the second active patterns sequentially arranged in a second direction substantially perpendicular to the first direction,
    the plurality of trenches including a first trench, a second trench and a third trench between the first and second active patterns, and widths of the first to third trenches being different from each other; and
    a first isolation pattern, a second isolation pattern, and a third isolation pattern in the first, second and third trenches, respectively.

2. The active pattern structure of claim 1, wherein the active pattern array includes a plurality of active pattern groups arranged in the second direction, and the plurality of active pattern groups includes the active pattern group.

3. The active pattern structure of claim 2, wherein each active pattern group includes two of the first active patterns and two of the second active patterns, the two of the first active patterns and the two of the second active patterns included in each corresponding active group among the active pattern groups are symmetric with respect to a space between the two of the first active patterns of the corresponding active group.

4. The active pattern structure of claim 1, wherein the first, second and third isolation patterns include depths that are different from each other.

5. The active pattern structure of claim 1, wherein
    the first trench is between two adjacent first active patterns among the first active patterns,
    the second trench is between one of the first active patterns and one of the second active patterns adjacent to the one of the first active patterns, and
    the third trench is disposed between two adjacent second active patterns among the second active patterns.

6. The active pattern structure of claim 5, wherein
    the plurality of trenches includes two second trenches and two third trenches,
    the two second trenches include the second trench,
    the two third trenches include the third trench,
    the first trench is between the two second trenches and the two third trenches such that opposite sidewalls of the first trench are spaced apart from the two second trenches in the second direction and the two third trenches in the second direction, respectively, and
    the two second trenches are between the first trench and the two third trenches in the second direction.

7. The active pattern structure of claim 5, wherein
    the first trench has a first width,
    the second trench has a second width greater than the first width, and
    the third trench has a third width greater than the second width.

8. The active pattern structure of claim 5, wherein
    the first trench has a first depth,
    the second trench has a second depth greater than the first depth, and
    the third trench has a third depth greater than the second depth.

9. The active pattern structure of claim 1, wherein
    the first active patterns include opposite sidewalls that have different lengths from each other in a vertical direction, and
    the second active patterns include opposite sidewalls that have different lengths from each other in the vertical direction.

10. The active pattern structure of claim 1, wherein critical dimensions of the first and second active patterns are substantially equal.

11. A semiconductor device, comprising:
    a substrate including an active pattern array defined by a plurality of trenches in the substrate,
    the active pattern array including a plurality of first and second active patterns, each of the first and second active patterns extending in a first direction,
    the plurality of trenches including a first trench, a second trench and a third trench disposed between the first and second active patterns,
    widths of the first trench, the second trench, and the third trench being different from each other,
    the first trench being disposed between adjacent first active patterns among the first active patterns,
    the second trench being disposed between two of the second active patterns and the adjacent first active patterns, and the third trench being disposed between two adjacent second active patterns among the second active patterns;

a first isolation pattern, a second isolation pattern and a third isolation pattern in the first, second and third trenches, respectively; and a transistor on the active pattern array and the first, second and third isolation patterns.

12. The semiconductor device of claim 11, wherein the second trench and the third trench are sequentially disposed in a second direction from opposite sidewalls of the first trench in the active pattern array, and the second direction crosses the first direction.

13. The semiconductor device of claim 12, wherein the first trench includes a first width and a first depth, the second trench includes a second width greater than the first width and a second depth greater than the first depth, and the third trench includes a third width greater than the second width and a third depth greater than the second depth.

14. The semiconductor device of claim 12, wherein the first, second and third isolation patterns fill lower portions of the first, second, third trenches, respectively, to expose upper sidewalls of the first and second active patterns, and the transistor includes a fin-field effect transistor on the upper sidewalls of the first and second active patterns exposed by the first to third isolation patterns and upper surfaces of the first and second active patterns.

15. The semiconductor device of claim 12, wherein each of the first and second active patterns includes a tunnel, and the transistor includes a multi-channel transistor including a gate structure filling the tunnel and extending in a second direction crossing the first direction.

16. An active pattern structure of a semiconductor device, comprising:

a substrate including a plurality of first active patterns and a plurality of second active patterns defined by a plurality of trenches in the substrate, the plurality of trenches including a plurality of first trenches, a plurality of second trenches, and a plurality of third trenches extending in a first direction, a depth of the plurality of second trenches being greater than a depth of the plurality of first trenches and less than a depth of the plurality of third trenches, the plurality of first active patterns and the plurality of second active patterns extending in the first direction and being organized into a plurality of active pattern groups, at least one active pattern group among the active pattern groups being between a pair of the plurality of third trenches, and the at least one active pattern group among the active pattern groups including a pair of the first active patterns between a pair of the second active patterns and separated from the pair of the second active patterns by a pair of the plurality of second trenches, the pair of the first active patterns being spaced apart from each other in a second direction by one of the plurality of first trenches between the pair of the first active patterns.

17. The active pattern structure of claim 16, wherein a width of one of the first active patterns is substantially equal to a width of at least one of the second active patterns.

18. The active pattern structure of claim 16, wherein the first trenches have a first width, the second trenches have a second width greater than the first width, and the third trenches have a third width greater than the second width.

19. The active pattern structure of claim 16, wherein the plurality of first active patterns include a plurality of third active patterns spaced apart from each other in the first direction, and the plurality of second active patterns include a plurality of fourth active patterns spaced apart from each other in the first direction.

20. A semiconductor device, comprising:

the active pattern structure of claim 16;

a first isolation pattern, a second isolation pattern, and a third isolation pattern in the plurality of first trenches to the plurality of third trenches, respectively; and a gate structure on the plurality of active pattern groups.

* * * * *